(12) United States Patent
Almog et al.

(10) Patent No.: US 9,914,065 B2
(45) Date of Patent: Mar. 13, 2018

(54) SELECTIVELY CONDUCTIVE TOY BUILDING ELEMENTS

(71) Applicant: BRIXO SMART TOYS LTD., Rehovot (IL)

(72) Inventors: Boaz Almog, Rehovot (IL); Amir Saraf, Yavne (IL)

(73) Assignee: BRIXO SMART TOYS LTD., Rehovot (IL)

( * ) Notice: Subject to any disclaimer, the term of this patent is extended or adjusted under 35 U.S.C. 154(b) by 0 days.

(21) Appl. No.: 14/917,564

(22) PCT Filed: Sep. 3, 2014

(86) PCT No.: PCT/IL2014/050790
§ 371 (c)(1),
(2) Date: Mar. 8, 2016

(87) PCT Pub. No.: WO2015/033340
PCT Pub. Date: Mar. 12, 2015

(65) Prior Publication Data
US 2016/0220919 A1    Aug. 4, 2016

Related U.S. Application Data

(60) Provisional application No. 61/875,039, filed on Sep. 8, 2013.

(51) Int. Cl.
*A63H 33/04*    (2006.01)
*A63H 33/08*    (2006.01)
(Continued)

(52) U.S. Cl.
CPC ......... *A63H 33/042* (2013.01); *A63H 33/086* (2013.01); *H05K 1/0284* (2013.01);
(Continued)

(58) Field of Classification Search
CPC ....... A63H 33/04; A63H 33/042; A63H 33/26
See application file for complete search history.

(56) References Cited

U.S. PATENT DOCUMENTS 3,237,341 A * 3/1966 Janning ..................... F21S 9/02
273/238
3,346,775 A * 10/1967 Christiansen ........ H05K 1/0286
361/729
(Continued)

FOREIGN PATENT DOCUMENTS

CH    455606 A    4/1968
CH    455606 A    7/1968
(Continued)

OTHER PUBLICATIONS

International Search Report and Written Opinion for PCT/IL2014/050790, dated Dec. 11, 2014, 10 pages.
(Continued)

*Primary Examiner* — Gene Kim
*Assistant Examiner* — Alyssa Hylinski
(74) *Attorney, Agent, or Firm* — FisherBroyles, LLP; Robert Kinberg

(57) ABSTRACT

The present invention relates to a selectively conductive toy building element, comprising: a body adapted for releasable engagement to at least one other toy building element body or to a corresponding baseplate, the body including at least one conductive portion having at least one contact area adapted to generate pressure on a conductive portion or contact area of an adjacent toy building element body, in such a way that ensures electrical conduction between said toy building elements in a desired location and direction.

18 Claims, 10 Drawing Sheets

(51) Int. Cl.
*H05K 1/02* (2006.01)
*H05K 1/11* (2006.01)
*H05K 3/32* (2006.01)

(52) U.S. Cl.
CPC ............. *H05K 1/119* (2013.01); *H05K 3/326* (2013.01); *H05K 2201/0367* (2013.01); *H05K 2201/091* (2013.01); *H05K 2201/09045* (2013.01); *H05K 2201/09081* (2013.01); *H05K 2201/0999* (2013.01); *H05K 2201/209* (2013.01)

(56) References Cited

U.S. PATENT DOCUMENTS

| | | | |
|---|---|---|---|
| 3,445,749 A | | 7/1969 | Gow |
| 3,553,883 A | * | 1/1971 | Fischer ................ A63H 33/042 446/91 |
| 3,576,936 A | * | 5/1971 | Fischer ................ A63H 33/042 434/224 |
| 4,121,374 A | * | 10/1978 | Fischer ................ A63H 33/084 446/118 |
| 4,552,541 A | * | 11/1985 | Bolli .................... A63H 33/042 446/128 |
| 4,556,393 A | * | 12/1985 | Bolli .................... A63H 33/042 446/128 |
| 4,715,832 A | * | 12/1987 | Bach .................... H01R 9/2408 439/715 |
| 4,743,202 A | * | 5/1988 | Bach .................... H01R 9/2408 439/53 |
| 4,883,440 A | * | 11/1989 | Bolli .................... A63H 33/042 439/752 |
| 5,455,749 A | * | 10/1995 | Ferber .................. A41D 1/005 362/103 |
| 6,805,605 B2 | * | 10/2004 | Reining ............... A63H 33/086 446/484 |
| 8,221,182 B2 | * | 7/2012 | Seymour .............. A63H 33/04 446/120 |
| 9,016,902 B1 | * | 4/2015 | Lin ....................... F21S 2/005 362/249.01 |
| 2005/0112987 A1 | * | 5/2005 | Chan .................... A63H 17/262 446/93 |
| 2007/0184722 A1 | * | 8/2007 | Doherty ............... A63H 33/042 439/638 |
| 2008/0166926 A1 | * | 7/2008 | Seymour .............. E04B 2/06 439/701 |
| 2008/0220690 A1 | * | 9/2008 | Munch ................. A63H 33/042 446/128 |
| 2009/0047863 A1 | * | 2/2009 | Capriola ............... A63H 33/042 446/91 |
| 2009/0293268 A1 | * | 12/2009 | Carmi .................. H01P 11/003 29/825 |
| 2011/0031689 A1 | * | 2/2011 | Binder .................. A63F 9/1011 273/157 R |
| 2011/0143629 A1 | * | 6/2011 | Seymour .............. A63H 33/04 446/91 |
| 2011/0263177 A1 | | 10/2011 | Lemchen |
| 2013/0217295 A1 | * | 8/2013 | Karunaratne ........ A63H 33/086 446/124 |

FOREIGN PATENT DOCUMENTS

| | | |
|---|---|---|
| CN | 102686290 A | 9/2012 |
| CN | 203139632 U | 8/2013 |
| GB | 1139315 | 6/1966 |
| GB | 1139315 A | 1/1969 |
| JP | H08511354 A | 11/1996 |
| WO | 94/28348 A1 | 12/1994 |

OTHER PUBLICATIONS

Ogunniyi, Adedoyin, "Conductive Legos" Oct. 4, 2011 (http://courses.media.mit.edu/2011fall/mass62/wp-content/uploads/2011/Conductive-LEGOS.pdf).

Ogunniyi, Adedoyin, Conductive LEGOS, Oct. 4, 2011, available at http://courses.media.mit.edu/2011fall/mass62/wp-content/uploads/2011/10/Conductive-LEGOS.pdf.

Chinese Office Action, dated Apr. 1, 2017, in related CN Appln. No. 201480049449.5, and English translation thereof.

Supplementary EP Search Report, dated May 9, 2017, in related EP Appln. No. 14841564.9.

* cited by examiner

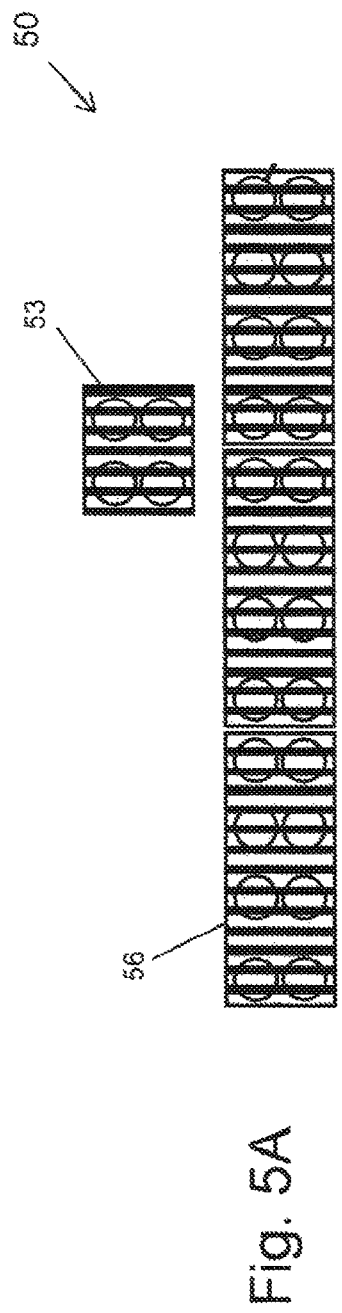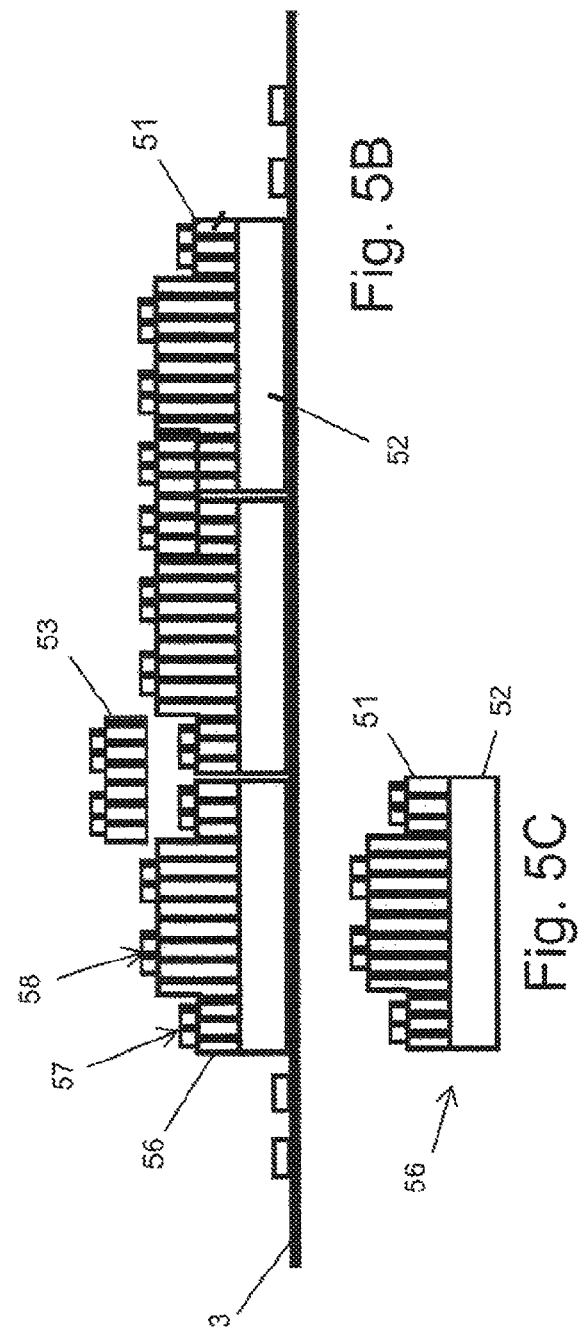

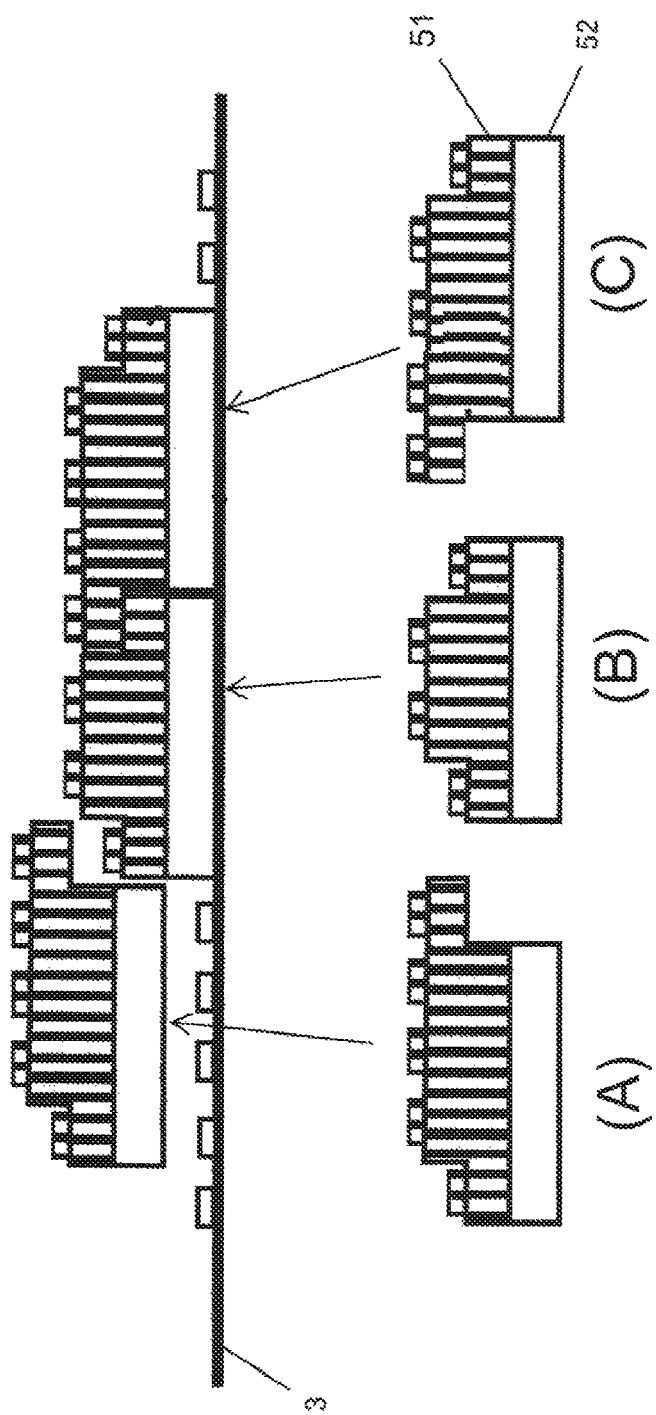

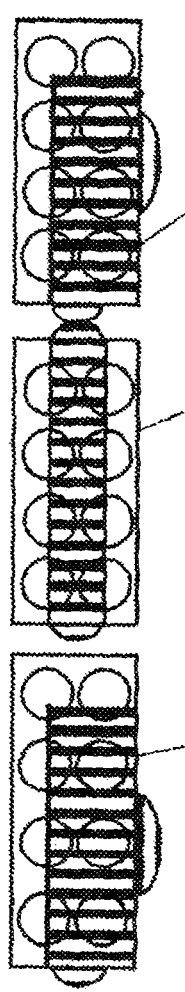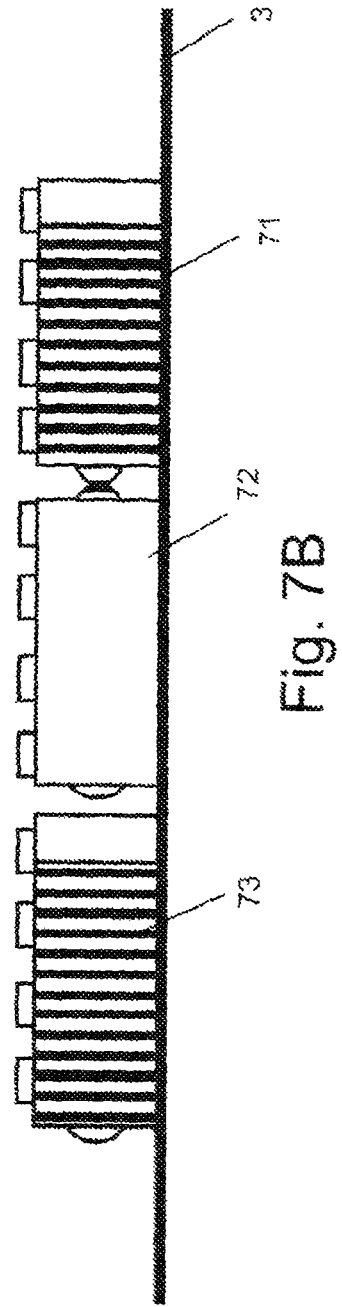

SELECTIVELY CONDUCTIVE TOY BUILDING ELEMENTS

FIELD OF THE INVENTION

The present invention relates to the field of building systems. More particularly, the invention relates to releasably interconnecting building elements (e.g., toy bricks of the type generally referred to as "LEGO bricks") that conduct electricity in one or more selected directions.

BACKGROUND OF THE INVENTION

Connectable bricks toys, such as the building elements provided by LEGO, allow one to build three dimensional structures and provide a unique educational experience. Playing with such bricks develops skills such as 3D vision, creativity, engineering, role-playing and more. The common toy bricks have been supplemented with dedicated building elements with either a specific appearance or a mechanical or electrical function to enhance the play value. Such functions include e.g. motors, switches and lamps, but also programmable processors that accept input from sensors and can activate function elements in response to received sensor inputs. In some cases, a state-of-the-art electronic system is incorporated in the building elements, to allow programmable robotic construction, remote control actions and more, such as the ROBOTICS INVENTION SYSTEM kit manufactured by LEGO MINDSTORMS. However, the electronic aspects of these kits cannot be easily exploited by the user and combining multiple electric components is at best limited.

Today, many connectable toy bricks are made of a non-conductive plastic material, such as Acrylonitrile Butadiene Styrene (ABS). These are designed in such a way that two bricks are well connectable to each other as well as easily disassembled. Many building kits allow the construction of highly sophisticated 3D models as along with simple shapes. Some kits combine electric elements such as motors, lights and sensors, by mechanically attaching them to existing blocks. In some instances, electric components are embedded or encased in a plastic brick, which allows direct attachment to other bricks In such electronic sets all the wiring is done by regular wires that are not a part of the construction. Electrically connecting the circuit is straightforward and simplified connectors are provided to plug-in the wires into each of the components. The electric circuitry is invisible to the user in the sense that the wires usually come in pairs and the only construction experience is connecting parts together. The educational experience is limited as the user does not learn much about electronics and electric circuit; moreover, it is limited by the need to connect actual wires, which may become entangled, limit the mechanical movement and are unpleasing to the eye. Furthermore, such elements do not include basic electronic components such as capacitors, coils, resistors, etc.

Another popular theme of science educational kits are electronic kits. These usually comprise specific theme-based, stand-alone kits, in which the user experience involves connecting an electrical circuit that performs a certain function. Examples of such kits are—solar energy kit (solar powered vehicles), electric water fountains, electric alarms, electric turbines, etc. Many kits use a plastic board onto which electric wires are connected, either directly or through mechanical devices (springs). Electric components can be mechanically attached to the board. However, such electronic kits are limited because the user experience is limited to placing components and connecting wires in a way that the path through which current flows is not visually evident. The result is usually an entanglement of wires that completely masks the circuit structure and its functionality. Thus, the educational value and learning experience is at best limited. Moreover, the components of each kit cannot be used in other setups or other kits and are usually limited to the specific kit for which they were designed.

Some prior-art publications disclose a variety of arrangements for providing conductive building toy bricks, such as U.S. Pat. No. 3,346,775, U.S. Pat. No. 3,553,883, U.S. Pat. No. 4,556,393, U.S. Pat. No. 6,805,605. However, such arrangements require electric components or conductive pins to be embedded inside the building toy bricks. For example, in U.S. Pat. No. 3,346,775 the electric connection between blocks is via a wire and a pin from underneath to a conductive board. U.S. Pat. No. 6,805,605 discloses toy bricks having conducting pins inserted inside which conduct electricity from top to bottom.

U.S. Pat. No. 4,556,393 discloses a toy building brick with electrical contacts that have at least two rows and in each row at least one selected pin to conduct electricity. The conduction is between the selected pins and the opposite facing sockets. This toy building block lacks the ability to conduct along the lateral side portion of the brick. Moreover, the selected pins are always displaced longitudinally from one another.

A project published online on Oct. 4, 2011 by Adedoyin Ogunniyi under the name "Conductive LEGOS" (http://courses.media.mit.edu/2011fall/mass62/wp-content/uploads/2011/10/Conductive-LEGOS.pdf), teaches how to take plastic connectable bricks (LEGO brand) and coat them with a highly conductive copper layer by electroplating, a well-known technique for coating materials with metals. FIGS. 1A, 1B and 1C schematically show such conductive connectable bricks, indicated by numerals 1, 2 and 6.

Swiss patent application CH 455606A "Element for Building Toys" discloses building bricks of the same type, which are modified to contain electrical components so that they may be used to form electrical circuits. The bricks are normally made of a plastics material and may be coated with a conducting film, e.g. by spraying on a metal film or by fitting a metal foil molded to fit over or with holes cut to fit round the pins or posts that are configured for releasable engagement within recessed areas of other building bricks.

Coated bricks as disclosed by the "Conductive LEGOS" project and by CH 455606A can be used to conduct electricity whenever they touch each other. However, the electric contacts between adjacent bricks are erratic (as shown in FIGS. 1A, 1B and 1C), as the two adjacent bricks 1 and 2 may not always touch each other and conduct electricity due to an air gap 4 that sometimes occurs between the side portions of the adjacent bricks, thus breaking electric contact. Normally, the side portions of such bricks do not have any connecting surface, which are usually located on the upper (male) and lower (female) surfaces of the bricks. The gap may occur when the bricks 1 and 2 (in the illustrative examples of FIG. 1) are placed one next to the other on a suitable baseplate 3, to which the bricks 1 and 2 are connected via the lower attachment surface located at the bottom of each brick. Brick 6 and brick 1 are connected in a conventional way, where the lower surface of brick 6, provided with female connecting elements suitable to house male connecting elements, is connected to the corresponding attachment surface at the upper surfaces of brick 1, which is provided with male connecting elements, such as small posts. In this common coupling way, usually no gap exists, as the bricks are firmly connected, as indicated by numeral 5.

Another drawback of copper coated plastic bricks is the oxidation of the copper. Once oxidized, the copper is no longer conductive and loses its shining metallic look. In addition, copper is a soft metal prone to scratches and mechanical damage.

In order to build electronic circuits from connectable bricks, one must assure that the bricks conduct electricity between each other in the desired side or direction. Moreover, it is desirable to have different bricks that conduct electricity between different faces (e.g., at least one of the side portions of a brick and/or at least part of the upper/lower surface that includes the attachment surface). For example, some bricks will conduct through segment(s) at their length and some through segment(s) at their width.

It is therefore an object of the present invention to provide a toy brick which is capable of conducting in selected directions.

It is another object of the present invention to provide conductive toy bricks in which the current path is visible through the shape and geometry of the bricks themselves.

Other objects and advantages of the invention will become apparent as the description proceeds.

SUMMARY OF THE INVENTION

The present invention relates to a selectively conductive toy building element, comprising: a body adapted for releasable engagement to at least one other toy building element body or to a corresponding baseplate, the body including at least one conductive portion having at least one contact area adapted to generate pressure on a conductive portion or contact area of an adjacent toy building element body, in such a way that ensures electrical conduction between said toy building elements in a desired location and direction.

According to an embodiment of the invention, the conductive portion is created by coating the body, at least partially, with a conductive layer.

According to an embodiment of the invention, the toy building element is coated by one or more layers of metals selected from copper, nickel and chrome.

According to an embodiment of the invention, the contact area extends outwardly from the conductive portion or the body.

According to an embodiment of the invention, the body includes an upper portion and/or a lower portion, wherein the upper portion has a top attachment surface and the lower portion has a bottom attachment surface, each of which surfaces are configured for releasable engagement with complementary attachment surfaces of other toy building elements.

According to an embodiment of the invention, at least one segment of the upper portion or the bottom attachment surface of the body are conductive after being coated with a conductive layer, thereby being useful as contact areas.

According to an embodiment of the invention, the top attachment surface has a portion that extends outwardly, resulting in a building element having an angular structure, such that said extended portion forms a 90 degrees angle with the side portion of the housing, thereby allowing to use said extended portion as a contact area.

According to an embodiment of the invention, at least one contact area of the toy building element is flexible or elastic in order to assure physical contact when pressed sideways with another toy building element.

According to an embodiment of the invention, at least one contact area comprises at least one embedded flexible arm that extends away from the element's body. According to an embodiment of the invention, the flexible arm is connected to the body only from one end in order to increase its flexibility.

According to an embodiment of the invention, the contact area has a rounded shape, thereby assuring smooth connectability to an adjacent toy building element.

According to an embodiment of the invention, the toy building element further comprises at least one electrical component housed inside a plastic compartment that is coupled to the element's body, wherein each electrical contact of said at least one electrical component is electrically connected to a corresponding contact area at said body, either directly or via wiring arrangement.

According to an embodiment of the invention, each electrical component includes or is coupled to at least one current limiting and/or current monitoring component.

In another aspect, the present invention relates to a method of manufacturing a selectively conductive toy building element, comprising:
  a) creating a connectable brick that has at least one portion adapted to generate pressure on a conductive portion or contact area of an adjacent building element; and
  b) applying a conductive layer to the surface of said at least one portion, thereby converting said at least one portion into a conductive portion that has at least one conductive contact area.

According to an embodiment of the invention, the method further comprises repeating the coating with additional metallic conductive layer.

According to an embodiment of the invention, the coating is applied using lithography techniques.

According to an embodiment of the invention, the lithography techniques involve etching the metallic layers from certain areas on the brick.

According to an embodiment of the invention, the coating is applied by attaching fully conductive and non-conductive parts to form a single brick.

In yet another aspect, the present invention relates to a kit comprising:
  a) a plurality of selectively conductive toy building elements, each of said toy building element comprising a body adapted for releasable engagement to at least one other toy building element body or to a corresponding baseplate, the body including at least one conductive portion having at least one contact area adapted to generate pressure on a conductive portion or contact area of an adjacent toy building element body, in such a way that ensures electrical conduction between said toy building elements in a desired location and direction;
  b) a plurality of non-conductive toy building elements; and
  c) conventional base plates and accessories of toy building systems.

BRIEF DESCRIPTION OF THE DRAWINGS

In the drawings:

FIGS. 5A, 5B and 5C schematically illustrate selectively conductive bricks, according to another embodiment of the present invention;

FIG. 6 schematically illustrates an exemplary geometrical structure of the bricks, according to an embodiment of the invention;

FIGS. 7A and 7B schematically illustrate two contact areas connected electrically by the conductive coating, according to an embodiment of the invention;

DETAILED DESCRIPTION OF THE INVENTION

Throughout this description the term "brick" is used to indicate a toy building element provided with one or more conductive segments (e.g., a region of the building element coated with a conductive material or covered with a metal layer), and which is part of an interlocking brick set comprising bricks that are adapted to be assembled and connected to construct three dimensional structures. This term does not imply any particular shape, construction material or geometry, and the invention is applicable to all suitable bricks that can be at least partially covered or coated with a conductive layer. For the sake of simplicity, embodiments of the invention will mainly be described using toy building elements in the form of bricks as examples. However, the invention may be applied to other forms of building elements used in toy building sets, such as a stacking rings toy for arranging objects on top of each other as shown hereinafter with respect to FIGS. 10A-10C and the invention is not limited to any specific shape and is meant to cover any suitable assembly system or game. Moreover, in some cases, the conductive area can be provided by the attachment of a metallic part to a nonconductive brick. The invention is not limited to any specific conductive coating material, but when metallic coatings are used they may comprise, for instance, copper, nickel and chrome.

In the following detailed description, references are made to the accompanying drawings that form a part hereof, in which specific embodiments or examples of selectively conductive toy building elements in the form of bricks are shown by way of illustration. However, the invention may be applied to other forms of building elements used in toy building sets. Moreover, different embodiments may be combined, other embodiments may be utilized, and structural changes may be made, without departing from the spirit or scope of the present invention. The following detailed description is therefore not to be taken in a limiting sense and the scope of the present invention is defined by the appended claims and their equivalents. Moreover, the terms, "for example", "e.g.", "optionally", as used herein, are intended to be used to introduce non-limiting examples. While certain references are made to certain example bricks, other bricks can be used as well and/or the example bricks can be combined into fewer bricks and/or divided into further bricks.

Figure 1A:
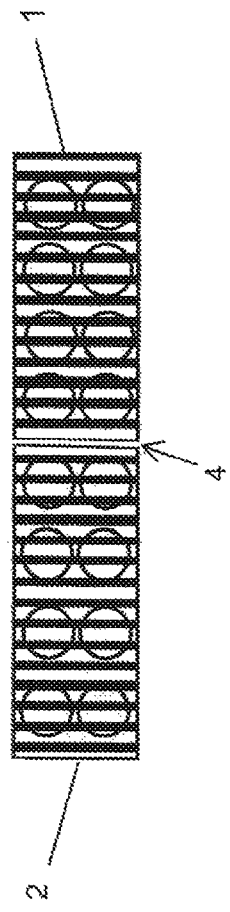
FIG. 1A schematically illustrates a top view of a conductive connectable brick, according to the prior art.
Figure 1B:
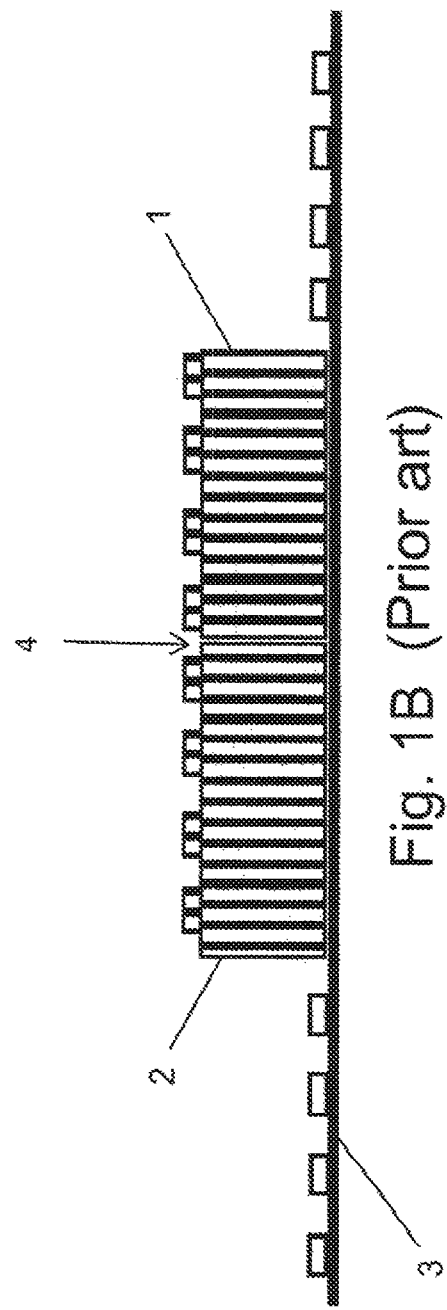
FIG. 1B schematically illustrates a side view of the conductive connectable brick of FIG. 1A located on a baseplate.
Figure 1C:
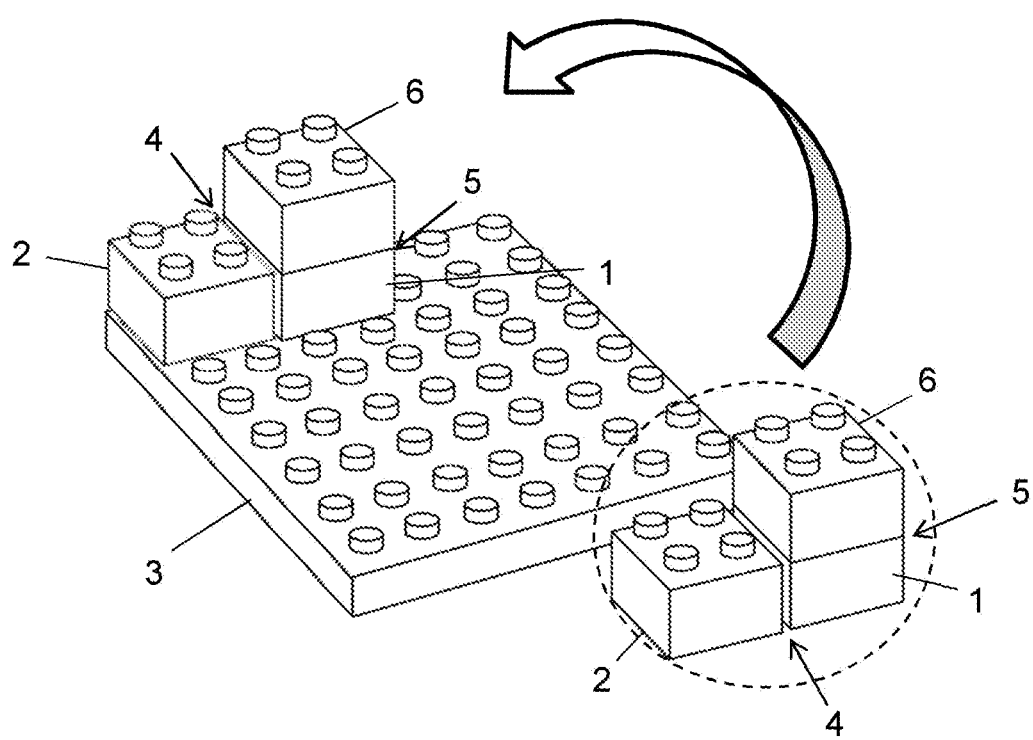
FIG. 1C schematically illustrates a perspective view of the conductive connectable brick located on a baseplate, according to the prior art.
Figure 2A:
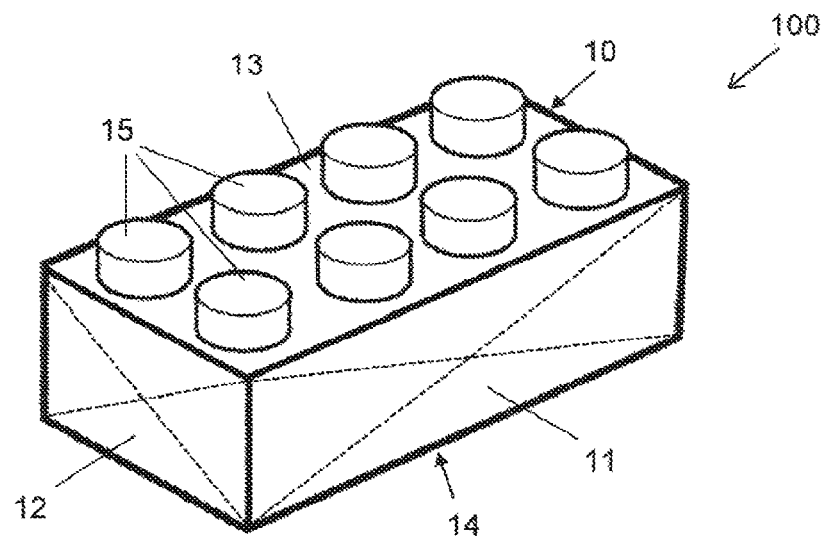
FIG. 2A schematically illustrates a perspective view of a selectively conductive brick provided with conductive side portion faces, according to an embodiment of the invention.
Figure 2B:
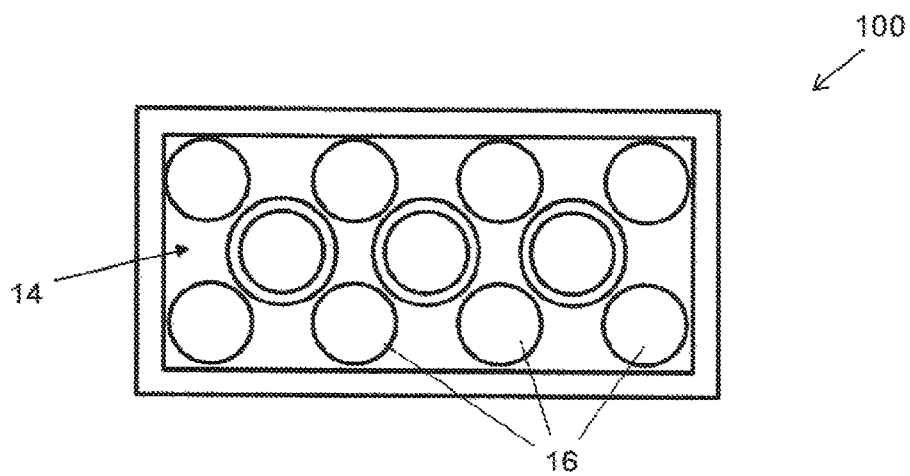
FIG. 2B is a bottom view of the selectively conductive brick of FIG. 2A.

FIGS. 2A and 2B show a selectively conductive brick that can be used in conjunction with the invention. The brick illustrated in this figure is particularly convenient because it can be applied as an ad-on building element to existing toy bricks sets without the need to carry out major alterations in the structure. The brick generally indicated by numeral 100 in the figure comprises a housing 10 having at least one segment coated with a metallic layer (as indicated by the side portions 11 and 12). The housing 10 is adapted for releasable engagement to at least one other toy brick. The housing 10 also includes an upper portion 13 and a lower portion 14. The upper portion 13 has a top attachment surface and the lower portion has a bottom attachment surface, each of which surfaces are configured for releasable engagement with complementary attachment surfaces of other toy bricks. In this embodiment, the top attachment surface has a plurality of posts 15 configured for releasable engagement within recessed areas of other toy bricks, and the bottom attachment surface has a recessed area 16 configured for releasable engagement of posts of other toy bricks. In this exemplary embodiment, the top attachment surface of the upper portion 13 is non-conductive (i.e., is not coated with a metal layer) and segments of the side portions 11 and 12 are coated with one or more metal layers (i.e., conductive segments).

Other variations to the invention are also possible. The foregoing description is provided for exemplary and illustrative purposes. The present invention is not necessarily limited thereto. For instance, the depicted brick 100 is a generally rectangular solid, with a 4×2 grid of posts 16. Other brick sizes and shape are possible within the scope of the present invention. For example, cylindrical brick shapes could be employed. Bricks with different numbers and configuration of posts could be used, as well as bricks with other types of attachment surfaces.

According to an embodiment of the invention, the brick 100 (which can be in the form of a standard LEGO brick or in any other shape and dimensions) is coated with a conductive metallic layer, either partially (i.e., only selected segments of the housing 10) or completely, and has a physical size that is smaller laterally than a corresponding non-conductive standard brick, which assures that an air gap does exist between conductive areas of adjacent bricks located on the same baseplate (i.e., assures that no uncontrollable physical contact between adjacent bricks will occur). In order to assure electrical conduction between adjacent bricks only in desired directions, brick 100 should be provided with at least one contact area that extends outwardly in the region of the coated layer. The physical shape of that contact area assures electrical conduction between adjacent bricks only in desired directions, as will be described herein with respect to FIG. 3, which shows embodiments of the selectively conductive brick of the present invention provided with such a contact area that extends outwardly.

In contradiction to the prior-art, the shape of the selectively conductive brick of the present invention is such that there is physical contact between two conductive bricks only in the desired locations on the brick, and none in all other locations, in such a way that ensures electrical conduction in a desired direction. The selectively conductive brick can be used together with non-conductive bricks and can be used in existing non-electric building kits. Due to the selective conduction of the bricks they can be used to build elaborate 3D electric circuitry.

According to an embodiment of the invention, the selectively conductive brick of the present invention may have one or more of the following properties:

- The size of the selectively conductive brick is smaller laterally than a corresponding non-conductive brick, in such a way that two adjacent conductive bricks will not be able to physically touch each other;
- The selectively conductive brick has at least one designated contact area that extends outwardly in the coated region, and which is therefore used to conduct electricity (as will be described in further details hereinafter with respect to FIGS. 3, 4A and 4B);
- At least one portion of the brick surface is coated with a conductive layer that is durable (physically), resistant to erosion and shining (i.e., having a metallic look);
- The selectively conductive brick has a form factor similar to non-conductive bricks and can be used with non-conductive brick sets.

Figure 3A:
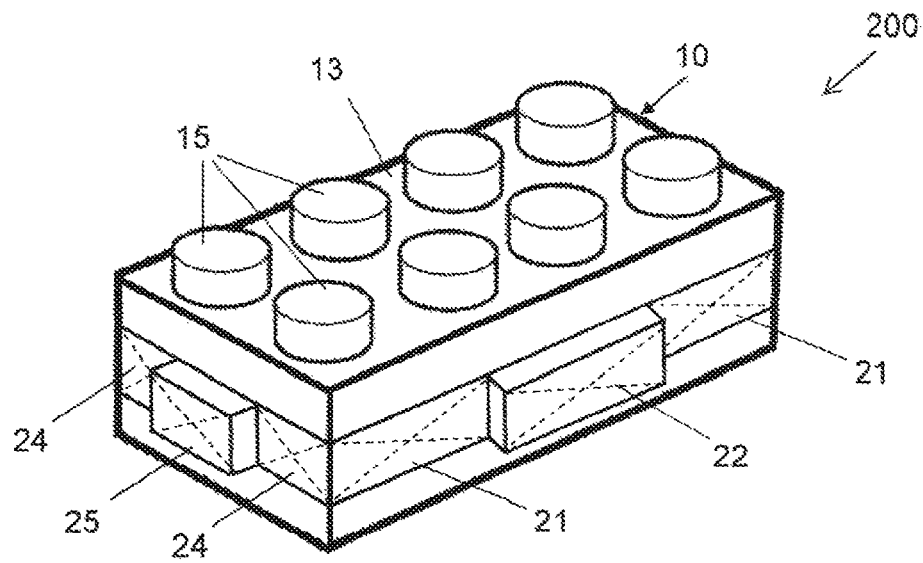
FIGS. 3A and 3B schematically illustrates a selectively conductive brick, according to other embodiments of the invention.

FIG. 3A schematically illustrates a conductive brick 200 provided with at least one designated contact area that extends outwardly, according to an embodiment of the present invention. Brick 200 comprises a conductive segment 21 provided on the side portion of the brick, and having a contact area 22 extending outwardly therefrom. The contact area 22 is adapted to physically contact an adjacent brick. Due to this arrangement and the aforementioned properties of the brick, the conductive segment 21 will not be able to physically contact an adjacent brick except in the contact area 22 protruding therefrom. Protruding portion 22 may have elastic properties that allow it some displacement toward or away from the brick body. In this embodiment, the top attachment surface 13 of brick 200 is a non-conductive face (i.e., not coated with a metal layer). In the same manner, brick 200 may further comprise additional conductive segments provided on other side portions of the brick, e.g., as the segment indicated by numeral 24 with a contact area 25 extending outwardly therefrom. According to some embodiments of the invention, the brick 200 can be entirely or almost completely conductive. For example, the entire brick can be coated with a metal layer including the upper portion and lower portions with the top attachment surface and the bottom attachment surface, respectively, such that both the top and bottom surfaces that are configured for releasable engagement with complementary attachment surfaces of other toy bricks can be used as contact areas.

According to an embodiment of the present invention, the brick is manufactured from a non-conductive plastic material e.g., Acrylonitrile Butadiene Styrene (ABS), in a form that includes one or more regions along the side portions that extend outwardly. Applying a metal layer that coats selected areas in the side portions including the region that extend outwardly results in the creation of conductive segments that include contact areas. The conductive segments with the contact areas are shown in FIG. 3A as the regions that are marked with the dotted lines in an X shape. Each region that extends outwardly may form any geometrical shape such as rectangular, rounded, etc. For example, the contact area may have a rounded shape to assure smooth connectability between adjacent bricks, as shown in FIGS. 4A and 4B.

Figure 3B:
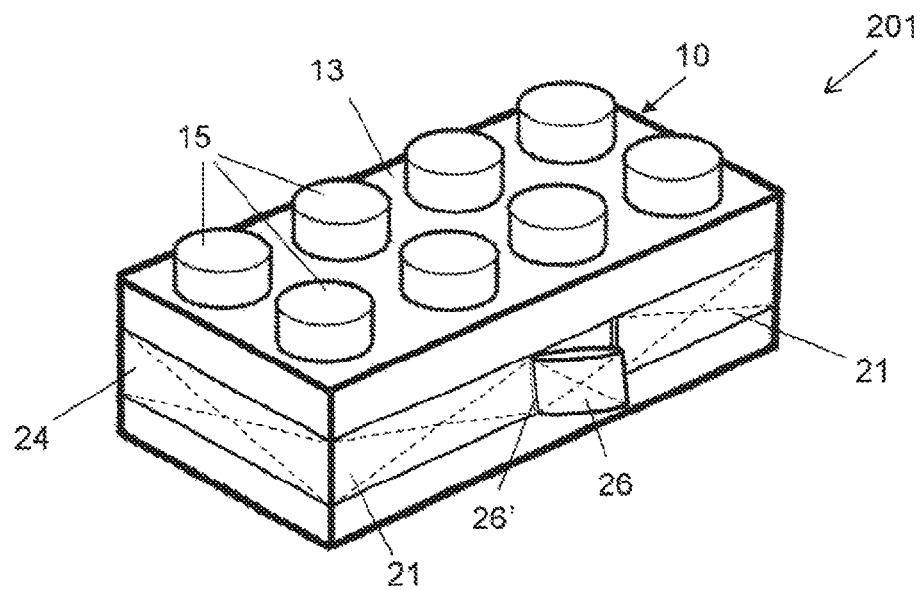

According to some embodiments of the present invention the contact areas are flexible, elastic (e.g. are connected only from one end to the brick body as indicated by a contact area 26 in FIG. 3B, where only one end 26' of the contact area 26 is physically connected to the side portion 21 of the brick 201, thereby forming a flexible arm that extends away from the body of the brick) in order to assure physical contact when pressed sideways with another brick.

Figure 4A:
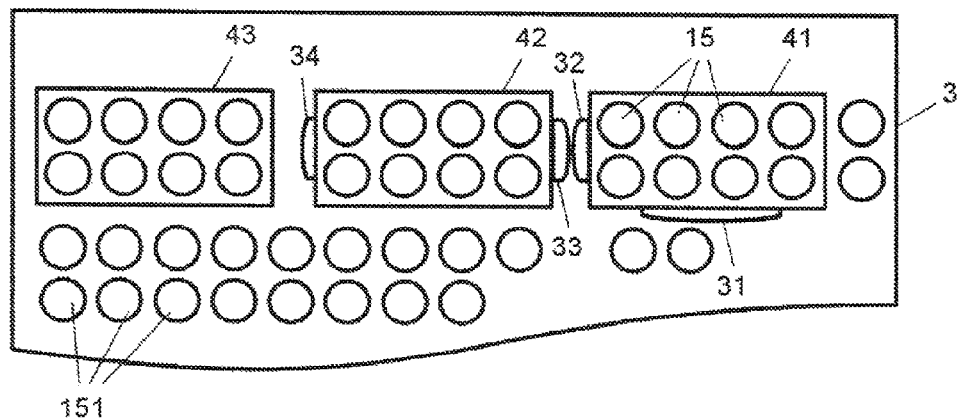
FIG. 4A schematically illustrates a top view of an exemplary configuration of a series of selectively conductive bricks, according to an embodiment of the invention.
Figure 4B:
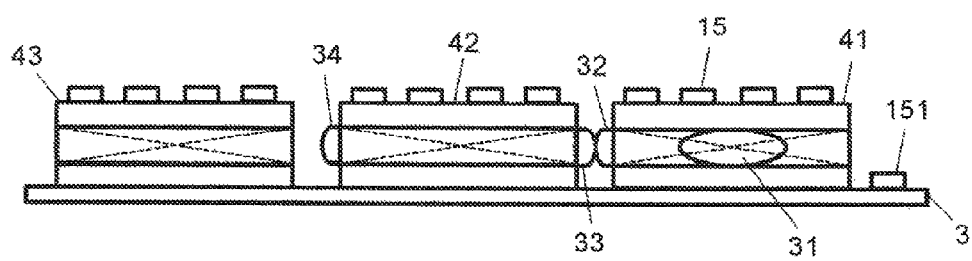
FIG. 4B is a side view of the exemplary configuration of FIG. 4A.

FIGS. 4A and 4B schematically illustrate an exemplary configuration of a series of selectively conductive bricks placed on a corresponding baseplate 3, according to an embodiment of the invention. The series includes three rectangular selectively conductive bricks 41, 42 and 43 that are positioned in a serial manner with respect to their width. Exemplary brick 41 includes two contact areas provided on one of its length sides and on one of its width sides, as indicated by numerals 31 and 32, respectively. Exemplary brick 42 includes two contact areas 33 and 34 located on both of its width sides. Exemplary brick 43 includes no contact areas. All bricks 41-43 include conductive segments as indicated by the dotted lines in an X form. In this configuration, only bricks 41 and 42 are electrically connected through the contact areas 32 and 33 as clearly shown in the figures. The baseplate 3 includes a top attachment surface with a plurality of posts 151 configured for releasable engagement within recessed areas located at the bottom of each of the bricks 41-43.

In some cases, the conductive regions are located on the top portion of the brick and they may include the top attachment surface, as shown in FIGS. 5A, 5B and 5C by a series of bricks 50 and as indicated on each one of them by a region 51 that is textured with zebra-like stripes. According to an embodiment of the invention, the top attachment surface or at least portion of it are used as the contact area.

In some cases, the contact area on the top portion of the brick has a graded attachment surface, as indicated by the shape of brick 56 in FIGS. 5B and 5C. In this embodiment, at least one part of the top attachment surface (as indicated by numeral 57) is slightly lowered from the rest of the top attachment surface (as indicated by numeral 58) in such a way that it allows another conductive brick (e.g., brick 53 in FIG. 5B) to be attached without changing the total height of the entire series of bricks 50.

In this embodiment, the lower portion of the brick 56 as well as the other bricks in the series 50 is non-conductive, as indicated by numeral 52 in FIGS. 5B and 5C.

According to an embodiment of the present invention, the top attachment surface of a brick may extend outwardly (as indicated by brick "A" and "C" in FIG. 6) such that the extended portion of the top attachment surface and the side portion form a 90 degrees angle. In this embodiment, the extended portion of the top attachment surface is used as the contact area.

As shown in the figure, brick "B" has a graded top attachment surface (similar to brick 56 in FIG. 5C) corresponding to the shape of bricks "A" and "C", thereby allowing to connect the bricks "A", "B" and "C" on the baseplate 3 while maintaining a uniform height for the obtained 3D structure.

In this embodiment, the lower portion of each of the bricks "A", "B" and "C" is non-conductive, as indicated by numeral 52, while the top portion of theses bricks (e.g., the regions that are textured with zebra-like stripes) are conductive (i.e., coated with a metallic layer) as indicated by numeral 51.

According to an embodiment of the invention, two or more contact areas on the same brick are connected electrically by the conductive coating as shown by bricks 71-73 in FIGS. 7A and 7B. In this embodiment, the conductive coating is used as a medium that electrically connect a first conductive segment at one side of the brick to a second conductive segment at other side of the brick, either via the top portion or via the side portion of the brick. This can be done in a variety of conductive routes along the brick, as schematically illustrated by bricks 71-73. For example, brick 71 shows a conductive route that electrically connects two adjacent sides of the brick. Alternatively, brick 72 shows a conductive route that electrically connects two sides of the brick that faces each other. In each brick the conductive route is indicated by the region textured with zebra-like stripes.

According to an embodiment of the present invention, the conductive coating is a stack of three metallic layers—copper, nickel and chrome. Such a coating has excellent electrical conductivity, is highly aesthetic (shining chrome), physically durable and erosion durable. For example, the total thickness of the coating can be 1-50 micron.

Figure 8:
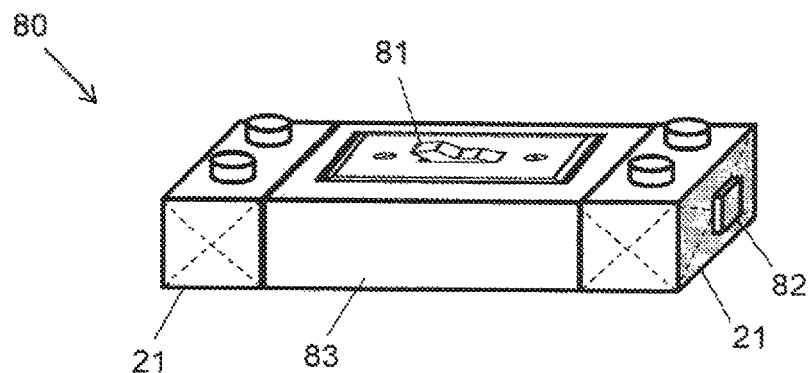
FIG. 8 schematically illustrates a selectively conductive brick provided with an electric component, according to an embodiment of the invention.

According to an embodiment of the present invention, a selectively conductive brick may include at least one electrical component, such as a switch, motor, light source, sensor, etc. FIG. 8 schematically illustrates a selectively conductive brick 80 provided with an electrical component 81. Brick 80 comprises at least one contact area 82 and the electric component 81 encased inside a plastic compartment 83 in the form of a connectable brick without conductive coating. In this arrangement, portions of the conductive brick 80 are coated/covered with metal layer(s) (as indicated by numerals 21 and the dotted lines), resulting in a conductive area that includes one or more contact areas 82. The electrical component 81 is electrically connected with the contact area 82, e.g., using a wiring arrangement within brick 80, or they may include metal elements embedded therein instead of the coated layers.

The plastic compartment 83 can be transparent, at least partially, to see therethrough the at least one electric component 81. The at least one electric component 81 is housed inside the plastic compartment 83 of brick 80 and is adapted to operate within it. For example, in the case when the electric component is a light source, it is adapted to generate light viewable through the plastic compartment 83. In the case when the electric component is a switch, it can be housed inside the plastic compartment 83 and operable from the outside to activate an electrical circuitry created by the selectively conductive bricks of the present invention.

Figure 9:
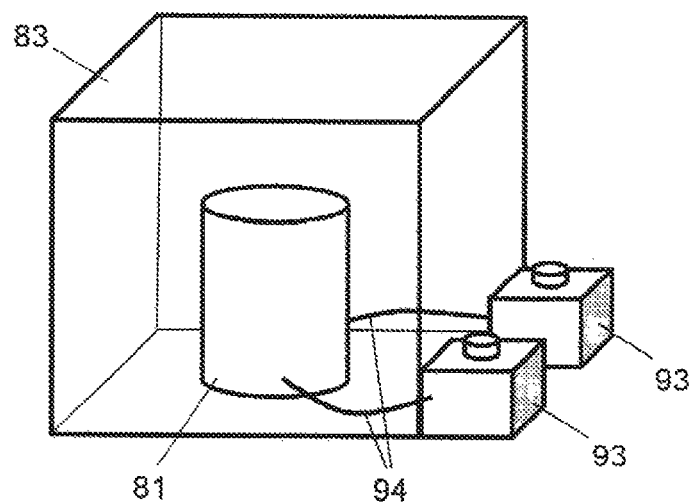
FIG. 9 schematically illustrates a selectively conductive brick provided with an electric component, according to another embodiment of the invention.

According to an embodiment of the present invention, the encased electric component 81 is electrically connected (e.g., as indicated by wires 94) to the contact areas of bricks 93, which now acts as electric lead, either by soldering or mechanical attachment (e.g., screws, etc.), as shown in FIG. 9.

For safety purposes, in some cases it is needed to prevent damages that might occur due to unwanted short circuit scenarios (e.g., it is possible that a careless user will short circuit the battery or current source, e.g. by closing an electric circuit only with selectively conductive bricks with no electric component brick). Such a short circuit is unwanted and can cause battery failure and in rare cases injury to the user. According to an embodiment of the present invention, a selectively conductive brick, which includes a battery case or an external connection to the power outlet, may also include at least one current limiting and/or current monitoring component, i.e., will act as a 'safety brick'. The current limiting can be achieved by, but not limited to, a reusable fuse such as a polymeric positive temperature coefficient device (or 'polyswitch') or any similar component that increases its electrical resistance when the current in the circuit exceeds a certain threshold, e.g. 1 Ampere. Alternatively or additionally, the 'safety brick' may include an embedded electric circuit that monitors the current and alerts the user when it exceeds a predefined threshold (e.g. 1 Ampere). The alert can be audible, visual, or a combination of both, e.g., the alert can be in the form of a warning sound and/or flashing light.

Figure 10A:
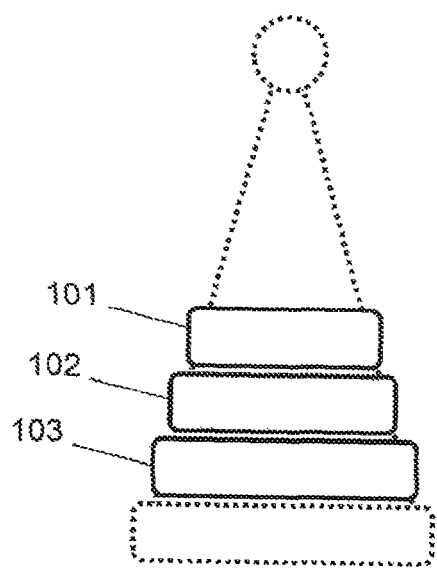
FIGS. 10A-10C schematically illustrate selectively conductive toy building elements implemented in the form of a stacking rings toy, according to an embodiment of the invention.
Figure 10B:
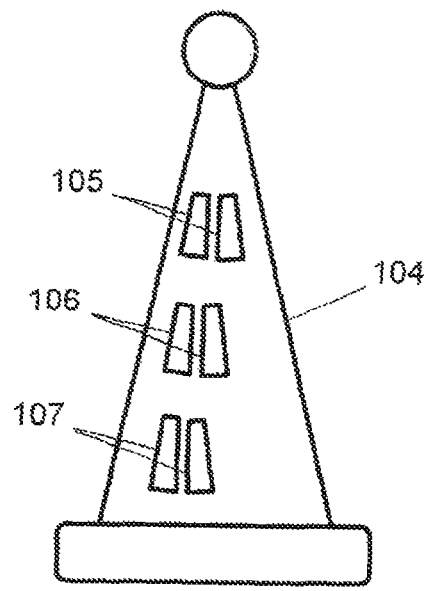
Figure 10C:
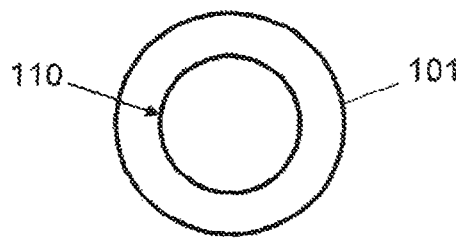

According to an embodiment of the present invention, a selectively conductive toy building element may be in the form of a torus. In this embodiment, the contact area may be a portion of the inner most part of the torus. When pressed elastically onto a matching base, e.g. an elastic cone, the conductive contact area closes an electric circuit and optionally performs an action such as turning lights on or making a sound. FIGS. 10A-10C schematically illustrate an implementation of a stacking rings toy, according to an embodiment of the invention. The stacking rings toy includes a plurality of torus-like toy building elements 101-103 each of which has a different diameter (FIG. 10A) and a corresponding cone 104 (FIG. 10B) on which the torus-like toy building elements 101-103 can be arranged on top of each other. The cone 104 includes one or more segments of conductive contact areas as indicated by numerals 105-107. FIG. 10C schematically illustrates a top view of the torus-like toy building elements 101, in which a contact area 110 is located at the inner most part of the torus 101.

Brick Manufacturing Process

According to an embodiment of the present invention, the manufacturing process of a selectively conductive brick involves the following steps:

designing a connectable brick of a specific shape that has at least one contact area as described hereinabove. The brick can be made using known methods (e.g. mold injection);

coating at least one section of the brick surface with a metallic conductive layer using known methods (e.g. electroplating techniques) and optionally, repeating the coating stage with additional layers as needed. The partial coating of the brick can be done either by:

Using lithography techniques (masking parts of the brick);

Etching the metallic layers from certain areas on the brick;

Attaching (by adhesive or mechanically) fully conductive and non-conductive parts to form a single brick.

The result of this process is a selectively conductive connectable plastic brick that conducts electricity in selected directions and is durable and highly aesthetic (metallic shining).

The process may further include the following options:

Encasing an electric component, such as a motor, light source, sensor, etc. inside plastic container; and Electrically connecting the electric component's wires to the conductive interfaces, which now act as electric leads, either by soldering or mechanical attachment (screws, etc.).

As will be appreciated by the skilled person the arrangement described in the figures results in a selectively conductive connectable toy brick that can look like standard LEGO or the like bricks and can be used together with existing, non-conductive brick sets. Moreover, the electrical conductivity is achieved along the toy brick (longitudinally), with the brick acting as a "wire". In addition, each brick has designated contact areas. The contact areas can be specific pin/sockets or embedded flexible or elastic elements that may have elastic properties that allow some displacement toward or away from the brick body for contacting an adjacent brick by generating pressure on the conductive portion or contact area of the adjacent brick.

An additional advantage provided by the invention is that the current path can be visualized by the shape and geometry of the bricks themselves. This is important educationally. Another advantage provided by the invention is that no additional parts (springs/wires/contacts) exist in the bricks which simplify the production and lower the cost.

All the above will be further appreciated through the following illustrative and non-limitative examples of use.

Electronic Teaching Kit

The kit may include a plastic non-conductive surface on which the bricks can be connected, a plurality of selectively connectable bricks, and several connectible electric components. The user is instructed to build specific electric circuits on the non-conductive board using the supplied parts. The circuit can be as simple as switching a light on/off, or complex as a radio/transmitter-receiver circuit.

The electric circuit is physically built by the user and the current path is visualized with the bricks.

Conductive Connectable Bricks and Connectable Electric Components are included with non-conductive building blocks. The user can build three-dimensional structures that incorporate electric circuitry by using the conductive bricks (rather than electric wires) to perform specific electric operations, e.g., a model house having lights in the ceiling with the electric circuitry embedded in the walls connecting the batteries, light switch and light source.

The connectable conductive bricks can be exchanged between different building kits thereby enriching the user experience and developing creativity and imagination.

The combination of non-conducting and conducting connectable bricks can produce mixed electrical and mechanical actions and constructions. Moving mechanical structures (such as a rotating arm) can be used as parts of an electric circuit (e.g. electric switches). Such combinations offer a unique user experience and provide an added educational value.

As an example of such embodiment, a pulley that raises a platform using an electric motor (a kind of elevator) can be considered. Once the platform reaches a certain position it short circuits an electric switch and triggers a certain task (e.g. disconnects the power and stops the pulley).

A Kit that Uses the 3D Nature of the Connectable Bricks to Solve 3D Puzzles.

The user is given a selected number of conductive and non-conductive bricks and instructed to use them to connect two points in space (e.g. on the supplied surface) to close an electric circuit that performs an action (e.g. switches on a light or plays a sound). The user must use only a certain set of conducting/non-conducting bricks to connect the leads. Such a 3D puzzle can be used to develop 3D vision.

Electronic Circuit Board

An electronic circuit board kit that includes selectively conductive, connectable bricks as well as various electric components such as transistors, capacitors, coils, resistors, etc. Such a kit can be used to build complicated electronic circuits with 3D conduction capabilities (circuits with multiple layers on top of each other can be build).

All the above description and examples have been given for the purpose of illustration and are not intended to limit the invention in any way. Many different mechanisms, bricks structure, and electronic elements can be employed, all without exceeding the scope of the invention.

The invention claimed is:

1. A selectively conductive toy-building element, comprising: a body adapted for releasable engagement to at least one other toy-building element body or to a corresponding baseplate, wherein the body has an upper portion, a lower portion and a plurality of sides extending between the upper and lower portions, each side having an inner surface and an outer surface, the outer surface of at least one of the sides including at least one conductive portion comprising an elastic arm that is attached at one end to the outer surface of said body and extends away from the outer surface, the elastic arm including at least a partial contact area having a conductive coating, wherein the elastic arm is adapted to generate pressure on an outer surface of an adjacent toy-building element by allowing displacement toward or away from the body, thereby avoiding an air gap between said elements and ensuring electrical conduction between said toy-building elements in a desired contact location and selected direction whenever the at least partial contact area with the conductive coating of the elastic arm of said toy-building element contacts a conductive portion or contact area on the surface of said adjacent toy-building element.

2. The toy-building element according to claim 1, wherein the conductive portion comprises a coating of one or more layers of metals selected from copper, nickel and chrome.

3. The toy-building element according to claim 1, wherein the contact area extends outwardly from the outer surface of the body of the toy-building element.

4. The toy-building element according to claim 1, wherein the upper portion has a top attachment surface and the lower portion has a bottom attachment surface, each of which surfaces are configured for releasable engagement with complementary attachment surfaces of other toy-building elements.

5. The toy-building element according to claim 4, wherein at least one of the top attachment surface and the bottom attachment surface of the upper portion and the bottom portion, respectively, include a conductive coating for use as a contact area.

6. The toy-building element according to claim 4, wherein the top attachment surface has a portion that extends outwardly, resulting in a building element having an angular structure, such that said extended portion forms a 90 degree angle with a side portion of the body, thereby allowing said extended portion to be used as a contact area.

7. The toy-building element according to claim 1, wherein the elastic arm is defined by a contact area of the toy-building element that is flexible or elastic in order to assure physical contact when pressed sideways with another toy-building element.

8. The toy-building element according to claim 7, wherein the elastic arm is embedded so that at least one contact area of the toy-building element comprises one or more embedded elastic or flexible arms that extend away from the body of the element.

9. The toy-building element according to claim 8, wherein the flexible arm is connected to the body only from one end in order to increase its flexibility.

10. The toy-building element according to claim 1, wherein the contact area has a rounded shape, thereby assuring smooth connectability to an adjacent toy-building element.

11. The toy-building element according to claim 1, further comprising a plastic component having a plastic compartment and at least one electrical component housed inside the plastic compartment which is coupled to the body of the element, wherein said at least one electrical component includes at least one electrical contact electrically connected to a corresponding contact area at said body, either directly or via a wiring arrangement.

12. The toy-building element according to claim 11, wherein the electrical component includes or is coupled to at least one current limiting and/or current monitoring component.

13. A method of manufacturing a selectively conductive toy-building element, comprising:
 creating a connectable brick comprised of a non-conductive material and which includes a top portion, a bottom portion and a plurality of sides extending between the top and bottom portions, each side having an inner surface and an outer surface, the outer side surface of at least one of the sides comprising at least one elastic arm that is attached to said outer side surface at one end, extends outwardly from said outer side surface and is adapted to generate pressure on a side portion of an adjacent building element that includes a conductive portion or contact area; and
 coating at least one section of said brick with a conductive layer, wherein said section includes said at least one elastic arm, thereby converting said at least one elastic arm into a conductive contact area.

14. The method according to claim 13, further comprising repeating the coating with an additional metallic conductive layer.

15. The method according to claim 13, wherein the coating is applied using lithography techniques.

16. The method according to claim 15, wherein the lithography techniques involve etching the metallic layers from certain areas on the brick.

17. The method according to claim 13, wherein the coating is applied by attaching fully conductive and non-conductive parts to form a single brick.

18. A kit comprising:
 a plurality of selectively conductive toy-building elements, each of said toy-building element comprising a body adapted for releasable engagement to at least one other toy-building element body or to a corresponding baseplate, the body having a top portion, a bottom portion and a plurality of sides extending between the top and bottom portions, each side having an inner surface and an outer surface, the outer surface of at least one of the sides including at least one conductive portion comprising an elastic arm that is attached at one end to the outer surface of said body and extends away from the outer surface, the elastic arm including at least a partial contact area having a conductive coating and which is adapted to generate pressure on a conductive portion or contact area of an adjacent toy-building element body by allowing displacement toward or away from the body to ensure electrical conduction between said toy-building elements in a desired location and direction;
 a plurality of non-conductive toy-building elements; and base plates and accessories of toy-building systems.

\* \* \* \* \*